United States Patent [19]
Adamian et al.

[11] Patent Number: 5,434,511
[45] Date of Patent: Jul. 18, 1995

[54] ELECTRONIC MICROWAVE CALIBRATION DEVICE

[75] Inventors: Vahe A. Adamian, Lexington; Michael T. Falcinelli, Andover; Peter V. Phillips, Leominster, all of Mass.

[73] Assignee: ATN Microwave, Inc., Billerica, Mass.

[21] Appl. No.: 66,534

[22] Filed: May 24, 1993

[51] Int. Cl.⁶ ............................................. G01R 35/00
[52] U.S. Cl. .................................. 324/601; 333/17.1; 333/18
[58] Field of Search ................... 324/601; 333/17.1, 18

[56] References Cited

U.S. PATENT DOCUMENTS

| | | |
|---|---|---|
| 3,454,906 | 7/1969 | Hyltin et al. |
| 3,559,108 | 1/1971 | Seidel |
| 4,450,419 | 5/1984 | Schwarzmann |
| 4,680,538 | 7/1987 | Dalman ........................ 324/601 |
| 4,764,740 | 8/1988 | Meyer |
| 4,816,767 | 3/1989 | Cannon ........................ 324/601 |
| 4,839,578 | 6/1989 | Roos ........................... 324/601 |
| 4,939,485 | 7/1990 | Eisenberg |
| 4,982,164 | 1/1991 | Schieck ........................ 324/601 |
| 5,034,708 | 7/1991 | Adamian et al. |
| 5,047,725 | 9/1991 | Strid .......................... 324/601 |
| 5,097,215 | 3/1992 | Eul ............................ 324/601 |
| 5,109,204 | 4/1992 | Keefer |

FOREIGN PATENT DOCUMENTS

| | | |
|---|---|---|
| 0150410 | 8/1985 | European Pat. Off. |
| 1345140 | 10/1987 | U.S.S.R. ....................... 324/601 |
| WO89/04001 | 5/1989 | WIPO |

OTHER PUBLICATIONS

Cronson: "A Six-Port Automatic Network Analyzer" IEEE Trans. on Microwave Theory-Dec. 1977-pp. 1086-1091.
Hewlett Packard Network Analyzers, Test & Measurement Catalog, Oct. 1991, USA.
Ferrero, A. and Pisani, U., "Two-Port Network Analyzer Calibration Using an Unknown Thru", IEEE Microwave and Guided Wave Letters, vol. 2, No. 12, Dec. 1992, pp. 505-507.
Froelich, R., "Measurement of GaAs FET Noise Parameters", Watkins-Johnson Co., vol. 13, No. 6, Nov./Dec. 1986, pp. 2-11.
Froelich, R., "Automated Tuning for Noise Parameter Measurements Using a Microwave Probe", Watkins-Johnson Co., Mar. 1989, pp. 83-96.
Adamian, V., "Stable Source Aids Automated Noise-Parameter Measurements", The Time and Measurement Notebook, Feb., 1988, pp. 51-58.
Rytting, D., "Advances in Microwave Error Correction Techniques", Hewlett-Packard, Jun. 1, 1987, pp. 1-39.
Curran, J., "TRL Calibration for Non-Coaxial Measurements", Hewlett-Packard, (1987).
Hewlett-Packard Product Note 8510-5A, "Specifying Calibration Standards for the HP 8510 Network Analyzer", Feb. 1, 1988.

*Primary Examiner*—Kenneth A. Wieder
*Assistant Examiner*—Jose M. Solis
*Attorney, Agent, or Firm*—Wolf, Greenfield & Sacks

[57] ABSTRACT

An electronic microwave calibration device provides an electronic load connected to each of two ports of a vector network analyzer. The load comprises a plurality of PIN diodes interconnected by transmission line. Each of the diodes are biased to generate different loads or conditions at each of the two ports. A control computer controls the biasing of diodes according to a predetermined procedure and compares impedance values measured at each of the two ports by the network analyzer to known values stored by the control computer. The control computer thereby derives calibration coefficients that are stored in the network analyzer and used by the network analyzer in performing further measurements.

14 Claims, 10 Drawing Sheets

ELECTRONIC MICROWAVE CALIBRATION DEVICE

FIELD OF THE INVENTION

This invention relates to a method and apparatus for automatically producing a plurality of complex reflection coefficients, a low-loss transmission coefficient, and a high isolation condition at the ports of a vector network analyzer.

BACKGROUND OF THE INVENTION

Measurement errors in any vector network analyzer (VNA) contribute to the uncertainty of the device being measured by the VNA. By quantifying these errors, their effects can be drastically reduced.

Measurement errors in network analysis can be separated into two categories: random errors and systematic errors. Random errors are non-repeatable measurement variations due to physical change (e.g. noise and temperature changes) and, therefore, are usually unpredictable. Systematic errors are repeatable measurement variations in the test setup itself.

In most measurements made on "devices under test" (DUT) with a VNA, the systematic errors are the most significant source of measurement uncertainty. Therefore, it is desirable to remove these errors from the VNA measurements. This is achieved through a VNA calibration.

It is known in the prior art to connect a number of well-known physical standards to each of the two ports of the VNA for the purpose of calibration. The systematic errors can be determined by computing the difference between the VNA measured response of the well-known standards and the correct response of the well-known standards.

However, before measuring the DUT, the performance of the calibration should be checked for its accuracy. It is therefore also common in the prior art to check the calibration accuracy by connecting a device with a well-known characteristics (a verification standard), which is different than that of the calibration standard, to the VNA. If the calibration of the VNA is performed properly, the measurement of the verification standard closely matches values previously obtained. However, if the measurement of the verification standard does not comply with other previous VNA measurements of the standard, then the operator knows that the calibration was not performed properly or that the VNA is not functioning properly.

Upon completion of verification of the VNA calibration, the operator can then connect the uncharacterized DUT to the VNA for measurement. The systematic error of the measurement system can then be removed mathematically from the measurement of the DUT.

A two-port DUT to be measured can have any of three possible configurations of connectors at its two ports. An "insertable" device has two connectors which are from the same connector family and of opposite sex, one connector being male and the other connector being female. An insertable two-port DUT is configured such that the calibration may be performed by connecting the two ports of a VNA together with the aid of a cable to establish a through-connection, during calibration, and without having to change the configuration of the measurement setup for the actual measurement of the DUT.

In contrast, a reversible DUT to be measured is characterized by two connectors of the same family but also of the same sex (either both male or both female). A reversible DUT is not "insertable" (e.g. "non-insertable") because the two ports of the VNA cannot be connected together to establish a through-connection during calibration without an adapter. However, the adapter is part of the calibration measurement. Therefore, it is common practice to calibrate with the adapter and to then perform the actual DUT measurement with another adapter of appropriate sex in order to try and reduce the measurement uncertainty. Alterntively, there is a second calibration technique which provides a better calibration accuracy which is shown in FIGS. 2 and 3 and is described below.

A second category of a "non-insertable" DUT comprises a transitional device which has two connectors that are of different families (e.g. one connector being coaxial and the other being waveguide). Similar to the reversible DUT, the disadvantage to measurements made on a transitional DUT is that the DUT cannot be inserted into the measurement system using the identical configuration which was used to calibrate the measurement system. The characteristic variations between these adapters cause added uncertainty in the measurement of the DUT.

It is common to use a calibration kit including a set of three physical standards of an appropriate connector family and sex to determine the error coefficients of a predetermined error model of a VNA. These physical standards usually consist of a short circuit connector, a shielded open circuit connector and both a fixed or sliding matched load termination. The standards also include several phase-matched adapters for use with the reversible DUT calibration as discussed above.

Full two-port calibration using a twelve-term error correction model to determine the systematic errors of a VNA is one of the most comprehensive calibration procedures. In order to determine all twelve terms of the error correction model for an insertable DUT, to be measured, each of the three measurement standards of the appropriate sex should be connected to the appropriate VNA port and measured. In addition, the two measurement ports of the VNA should be connected together via the use of the "through" connection.

The calibration setup and required connections to physical standards for an insertable device are shown in FIGS. 1A and 1B. Thus, an insertable device requires a minimum of six one-port (short, open, load) calibration standards 100, 102, 104, 106, 108 and 110 to be connected in succession to the VNA 112 ports 114 and 116, respectively, (three for each port) and measured, and one through-connection (FIG. 1B) in order to determine the twelve terms of an error correction model.

Alternatively, a non-insertable device requires that a minimum of twelve one-port calibration standards 120, 122, 124, 126, 128 and 130 (FIG. 2A) and 132, 134, 136, 138, 140 and 142 (FIG. 3A) be connected to the VNA ports 114 and 116 and measured. Furthermore, two through-connections must be made (FIGS. 2B and 3B) in order to perform a full two-port calibration. This technique requires that an adapter 144 with the same sex and family of the DUT be alternatively connected to each port 114 and 116 of the VNA 112 and a full two-port calibration be performed with the appropriate calibration standards. Thus, a non-insertable full two-port calibration requires a minimum of twelve one-port and two through-connections. However, it is possible to make the two through-connections shown in FIGS. 2B and 3B in succession by reducing the number of through-connections to one.

In addition, for a better accuracy calibration, a sliding termination is typically used instead of a matched load termination. A disadvantage of the sliding termination is that a measurement should be performed for at least three slide positions in order to obtain reliable measurements. It is common in practice to use five slide positions for the matched load measurement at each port thereby resulting in a total of ten matched load position measurements. Thus, for an insertable DUT broadband calibration, a minimum of eighteen measurements and seven connections is standard; and for a non-insertable calibration a minimum of thirty-six measurements and thirteen connections is standard.

A disadvantage of the above-described calibration procedure is that each calibration standard must be connected and measured one at a time. This procedure involves connecting the standard to the VNA port using the appropriate hardware to ensure proper connection and once proper connection is ensured, pressing the appropriate hardware key on the VNA to make the appropriate measurement. In addition, once the measurement has been made, the standard must be disconnected and another standard must be connected using the same procedure. As discussed above, this procedure is repeated for a minimum of seven connections and eighteen measurements with a broadband insertable DUT and a minimum of thirteen connections and thirty-six measurements to measure a broadband non-insertable DUT.

As a further disadvantage, a non-trained operator may confuse the standards (which are often confusingly similar in appearance) and operate the wrong hardware key on the VNA, measuring the wrong calibration standard. If the mistake is discovered at the end of the calibration, then the entire calibration must be repeated. Alternatively, if the calibration is not verified by the operator, via the use of a verification standard, after the full two-port calibration, the operator typically does not know that the calibration is flawed and that the DUT measurements are incorrect.

Additionally, the constant connections and disconnections of the calibration standards required by the calibration procedure results in connector wear and, therefore, non-repeatability in the calibration standard measurements. This non-repeatability in measurements contributes an additional error term to the calibration measurement which cannot be corrected.

Still another disadvantage of the prior art method of calibration is that the manual calibration procedure tends to be cumbersome and slow. Thus, a significant portion of valuable testing time is spent each day calibrating the VNA. If the calibration is not done correctly, then the operator must start over. The VNA should be recalibrated, depending upon the application, at least once each day in order to ensure appropriate measurement accuracy.

Accordingly, it is an object of this invention to provide a method and apparatus for calibrating a VNA which requires only one connection of the apparatus to each port of the VNA. It is a further object of this invention to provide a method and apparatus that essentially eliminates any errors resulting from connecting the wrong calibration standards to the VNA, and which allows untrained labor to calibrate the VNA while reducing the time required to perform the calibration. The calibration according to this method and apparatus can be performed automatically.

SUMMARY OF THE INVENTION

The present invention is directed to a method and apparatus for providing a programmable broadband, highly stable and repeatable two-port network to be used in determining the systematic errors of a VNA.

The two-port network of the present invention is comprised of a number of semiconductor devices interconnected through transmission lines. Each semiconductor device can be forward or reverse biased by programmable digital control circuitry. A multitude of well-known reflection coefficients can, therefore, be generated at each port of the two-port network by forward or reverse biasing selected semiconductor devices via the programmable digital circuitry. In addition, all of the semiconductors can be reverse biased such that the two-port network provides a low-loss transmission through-connection between the two ports of the network. Furthermore, a high isolation can be obtained between the two ports of the network by forward biasing several or all of the semiconductor devices simultaneously.

The programmable two-port network can be connected to each port of the VNA in order to provide multiple complex reflection coefficients to each port of the VNA. These well-known multiple reflection coefficients can be used as calibration standards at each port of the VNA for a one-port calibration. In addition, a full two-port calibration can be performed by providing, with the two-port network, multiple well-known reflection coefficients to each port of the VNA, a low-loss transmission through-connection between the two VNA ports and a high isolation condition between the two ports.

BRIEF DESCRIPTION OF THE DRAWINGS

The foregoing and other objects and advantages of the invention will become more clear with reference to the following detailed description of the preferred embodiments as illustrated by the drawings in which.

DETAILED DESCRIPTION OF THE PREFERRED EMBODIMENT

Figure 1A:
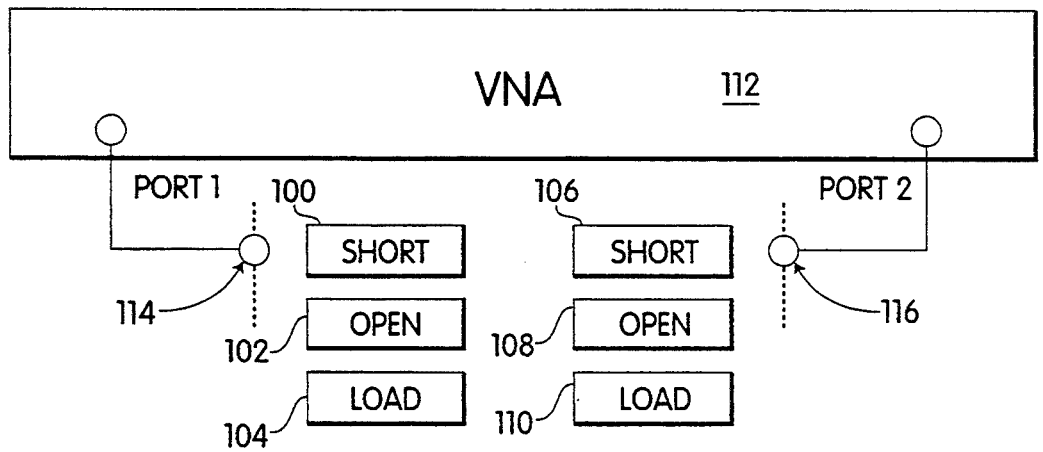
FIGS. 1A and 1B are schematic diagrams showing the calibration of a vector network analyzer for insertable devices to be measured according to the prior art.
Figure 1B:
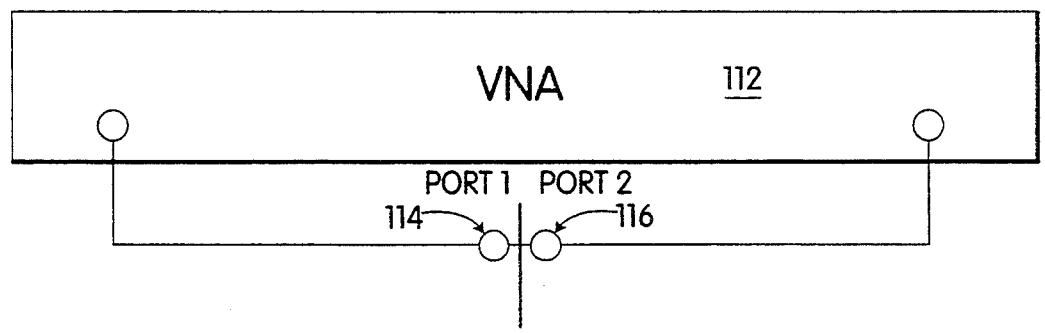
Figure 2A:
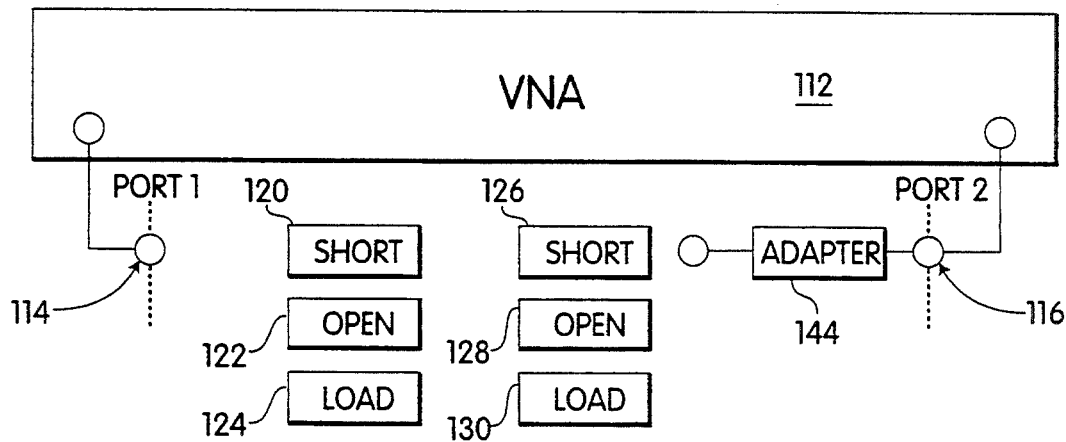
FIGS. 2A and 2B and 3A and 3B are schematic diagrams illustrating the calibration of a vector network analyzer for non-insertable devices to be measured using an adapter on each of the two ports according to the prior art.
Figure 2B:
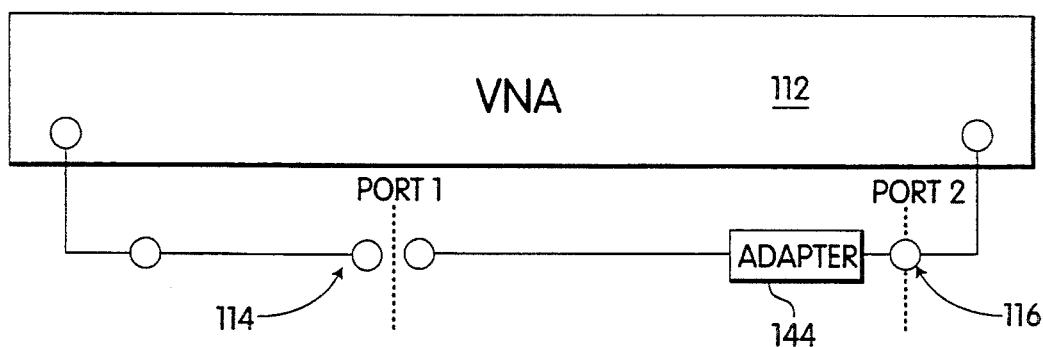
Figure 3A:
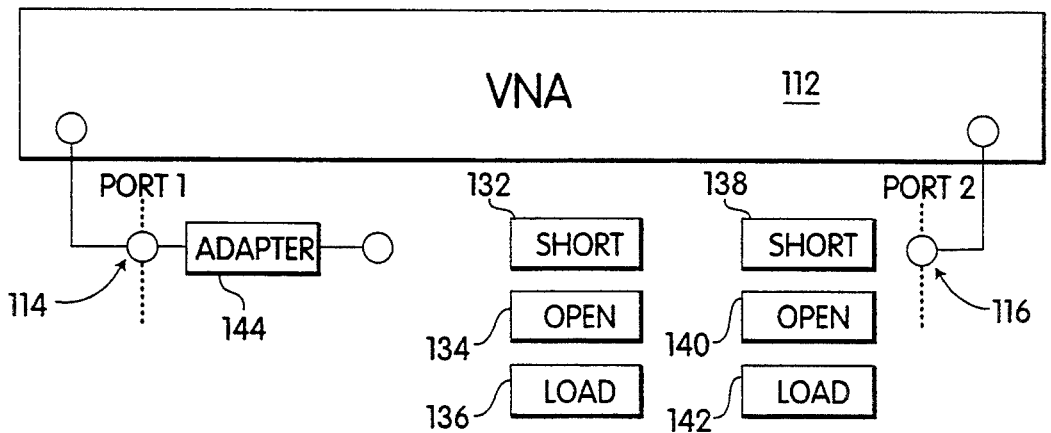
Figure 3B:
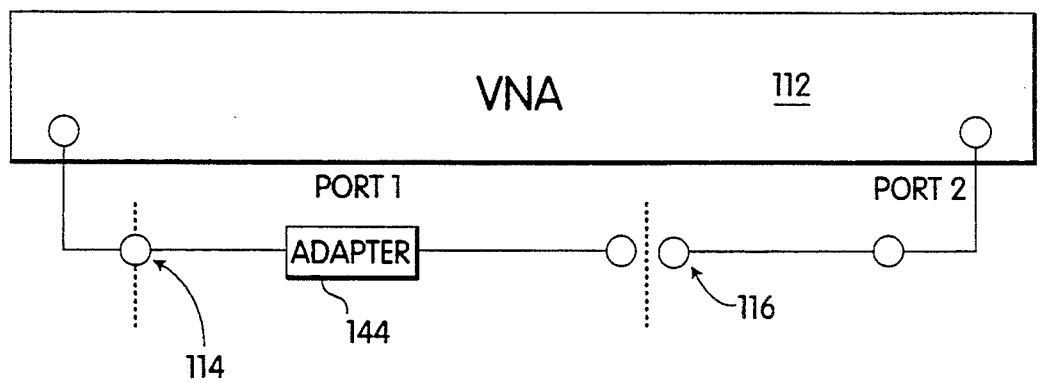
Figure 4:
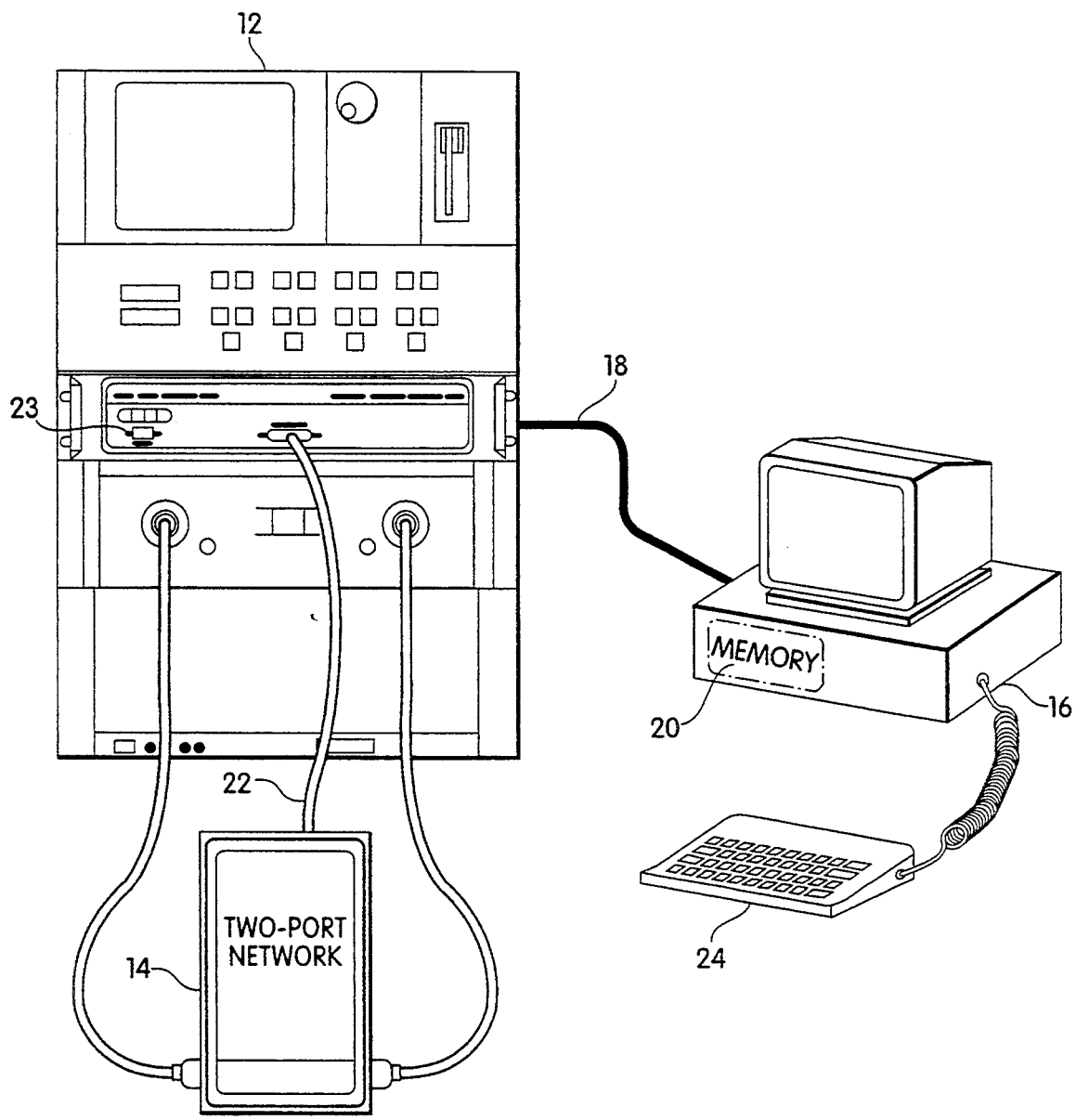
FIG. 4 is a schematic diagram of a calibration setup according to this invention.

FIG. 4 illustrates a measurement setup according to a preferred embodiment which can be used with the present invention to calibrate a VNA. The setup includes the VNA 12, a two-port network 14 according to this invention to be connected to both ports of the VNA and a computer control 16. The computer control 16 includes a data line 18 to the VNA 12 to receive the measured data from the VNA 12 and to control the VNA 12 with the aid of software stored in a local or permanent memory region 20 of the computer 16. The measurement setup also includes a control line 22 between a two-port network interface 23 and the two-port network which allows the computer or the VNA to control the two-port network in accordance with the control software stored in the memory of the computer. In addition, the computer control includes a keyboard interface 24 for interaction with an operator. Note that while a computer 16 is illustrated in this embodiment, the computer functions can be incorporated into the VNA 12 or into a microprocessor or other hardware and software device directly provided to the network 14.

Figure 5:
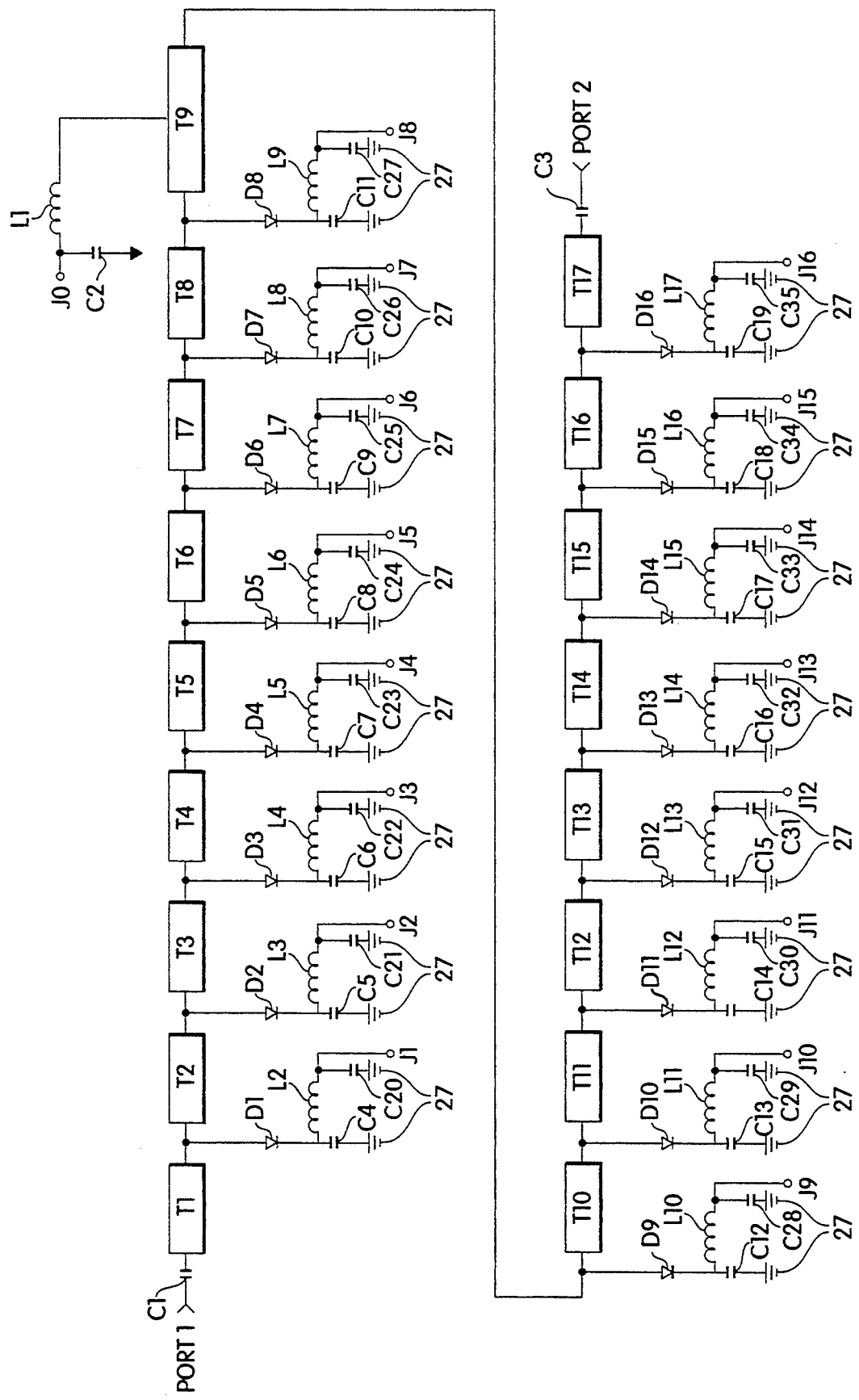
FIG. 5 is a more detailed schematic diagram of a two-port network circuit for use with the setup of FIG. 4 according to this invention.

FIG. 5 is a schematic of the microwave circuitry 25 contained in the two-port network 14 of the present invention. This circuitry is of a type disclosed in Applicants' U.S. Pat. No. 5,034,708 relating to a Broadband Programmable Electronic Tuner. The teachings of this patent are expressly incorporated by reference hereinto. The microwave circuitry 25 includes a number of pairs of PIN diodes D1–D16 and DC blocking capacitors C4–C19 in series which are separated according to this embodiment by various lengths of microstrip transmission line T1–T17. The series capacitor C4–C19 and PIN diode D1–D16 combinations are shunted to ground 27. The DC blocking capacitors C4–C19 establish the RF connection of the cathode side of each respective diode D1–D16 to ground. In the preferred embodiment of the invention, the transmission lines T1–T17 are constructed from 10 mil thick, known dielectric substrates which are laminated with copper on both sides wherein one side is etched to the appropriate dimensions. While such transmission line is utilized, equivalent forms of transmission line that establish a given electrical length are contemplated according to this invention. Similarly, while PIN diodes are utilized, other forms of switching devices are contemplated.

Referring to FIG. 5, a DC bias current is constantly established at connection J0. This current is established by a +5 volt supply according to a preferred embodiment. This DC bias current is supplied to the anode side of any of the PIN diodes D1–D16 through the RF bypass network consisting of RF coil inductor L1 and RF shunt capacitor C2. The RF bypass network prevents the interaction of RF and DC signals. Any of the PIN diodes D1–D16 can be forward biased by providing a DC current return path to the cathode sides of any of the diodes via any of the control lines connections J1–J16. By individually controlling the connection of the control lines J1–J16, any one corresponding individual diode D1–D16 may be forward or reverse biased. Each control line connection also includes an RF bypass circuit consisting of a series RF coil L2–L17 and a shunt RF capacitor C20–C35 which prevents interaction between the RF signals and the DC bias signals.

In FIG. 5, the DC blocking capacitors C1 and C3, which are placed in series with the RF transmission lines at the input of PORT 1 and PORT 2, prevent the DC bias signals used to bias the PIN diodes from exiting the two-port network.

The two-port network allows for a multitude of conditions to be established over a broad frequency band at both of its PORTS 1 and 2. These conditions include presenting a multitude of complex impedances at each port, a low-loss through-connection between the ports and a high isolation condition. In addition, the length and width of the transmission lines T2–T16 are chosen to ensure a unique phase relationship between each of the PIN diodes D1–D16. The selection of transmission line electrical length is based on the principle of prime numbers described in Applicants' U.S. Pat. No. 5,034,708 which is expressly incorporated hereinto by reference. This principle provides for minimizing the repetition of impedance values at either port of the two-port network. Thus, employing the prime number relationship ensures that the total line length from either input port of the two-port network to each diode is not evenly divisible by the line length from the input port to any other diode. However, other length relationships can be utilized according to this invention.

In FIG. 5, the microwave circuit allows for a plurality of microwave impedances, spread across the complex reflection plane, to be presented at both ports of the two-port network by controlling the signal present at the control lines J1–J16. The microwave circuit can be thought of as being a symmetrical circuit comprised of two equal circuits. Circuit one is comprised of transmission lines T2–T8 and the corresponding shunt PIN diode D1–D8 and series capacitor C4–C10 pairs between these transmission lines. Circuit two is comprised of transmission lines T10–T16 and the corresponding shunt PIN diode D9–D16 and series capacitor C12–C19 pairs. These two circuits are joined by transmission line T9 which is fed by the DC current supply connection J0 and the RF bypass network. The circuit is designed such that the transmission lines T2–T8 and T10–T16 are symmetrical about the transmission line T9. Therefore, transmission line length T2 is equal to transmission line length T16, T3 equals T15, T4 equals T14, T5 equals T13, T6 equals T12, T7 equals T11 and T8 equals T10. The length of the transmission line T9, according to this embodiment, is chosen so that, at the lowest frequency of desired operation, the round trip electrical length between PORT 1 to PIN diode D1 and the round trip electrical length between PORT 1 and PIN diode is a minimum of 240 degrees of phase difference for the condition where each diode is alternatively forward biased and the electrical length is measured. Similarly, the same phase relationship will exist at the lowest frequency of operation when diodes D3 and D16 are forward biased one at a time and connection is made to PORT 2.

In FIG. 5, the PIN diodes can be operated in one of two states. In a forward-biased state, the PIN diodes act as very small resistors (substantially short circuits). In a reverse-biased state, the PIN diodes can be modeled as a very small capacitor, at RF frequencies, and therefore a very high impedance (substantially open circuits). Establishing a DC ground connection to any of the control lines J1–J16 ensures that the appropriate diode is forward biased. Alternatively, any of the control lines J1–J16 can be set to a positive voltage substantially larger than that at port J0 so that the appropriate PIN diode will be reverse biased. Thus, it is possible to present a number of different impedances to either port of the two-port network. In addition, when all of the control lines are connected to DC ground such that all the PIN diodes are forward biased, the two-port network acts as a large-value attenuator providing a substantial amount of isolation between PORTS 1 and 2. In contrast, when all of the control lines are set to a positive voltage so that all of the PIN diodes D1–D16 are reverse biased, the two-port network acts as a low-loss through-connection between PORTS 1 and 2.

In a preferred embodiment, each capacitor C1–C3 has a capacitance of 200 pF, C4–C9 has a capacitance of 100 pF and C20–C35 has a capacitance of 820 pF; each inductor has an inductance of 40 nH; each transmission lines has a width of 0.30" and a physical length of T1=T17=0.061", T2=T16=0.035", T3=T15=0.039", T4=T14=0.035", T5=T13=0.039", T6=T12=0.035", T7=T11=0.214", T8=T10=0.243" and T9=0.627"; and each diode has a periphery of 0.015"×0.015"×0.005" with a series resistance of 2 ohms and a junction capacitance of 0.1 pF.

Figure 6:
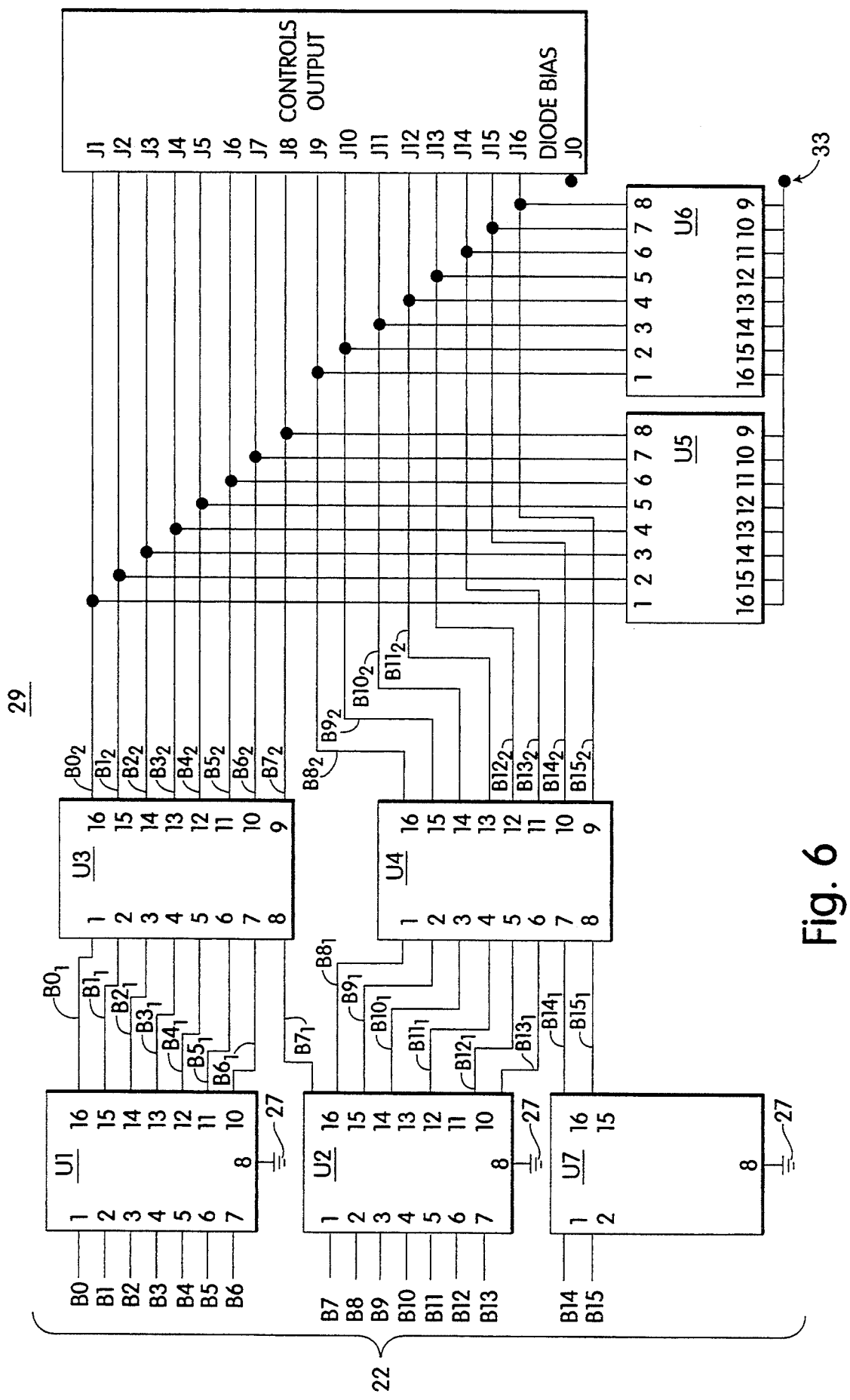
FIG. 6 is a more detailed schematic diagram of a digital control circuit for operating the two-port network circuit of FIG. 5.

FIG. 6 is a schematic of the digital circuit 29 included in the two-port network. The digital circuit 29 provides the appropriate bias to the control ports J1–J16 in accordance with the control signal 22 received from the computer control line, as best shown in FIG. 4. In FIG. 6, the computer control signal 22 is received by three commercially available Darlington transistor arrays U1, U2 and U7 (SN 75468). The Darlington transistor arrays U1, U2 and U7 are configured to receive a 16-bit TTL signal output by the computer control line 22. The word is transmitted on signal lines B0–B15 to U1 pins 1–7, U2 pins 1–7 and U7 pins 1–2 respectively. U1, U2 and U7 pins 8 are connected to ground 27. A TTL logic high on any one input line B0–B15 results in a corresponding output of the Darlington array U1, U2 or U7 providing a DC ground signal to the corresponding output control line $B0_1$–$B15_1$. Output control lines $B0_1$–$B6_1$ are connected to respective pins 16–10 of U1, $B7_1$–$B13_1$ are connected to respective pins 16–10 of U2 and $B14_1$ and $B15_1$ are connected to respective pins 16 and 15 of U7. A TTL logic low input to any of the Darlington array input ports does not enable the corresponding Darlington array output and, thus, the corresponding control line $B0_1$–$B15_1$ is pulled up to a +50 volt signal level which is presented to the corresponding PIN diode control line.

In FIG. 6, a pair of 68 ohm resistor networks U3 and U4 are placed between the output control lines $B0_1$–$B15_1$ of the Darlington arrays U1, U2 and U7 and the corresponding output control lines $B0_2$–$B15_2$ and are used to limit the current which can be drawn by each diode. In addition, there is provided a pair of one Mega-ohm resistor networks U5 and U6 which are placed at the outputs $B0_2$–$B15_2$ of the 68 ohm resistor networks which are in series with a +50 volt bias supply 33 according to this embodiment. The voltage supply 33 and resistor networks U5 and U6 act as a pull-up network for each output control which is not selected by the input TTL, signal thereby ensuring that a strong reverse bias signal is maintained on each control line J1–J16 for a PIN diode which has not been selected.

Figure 7:
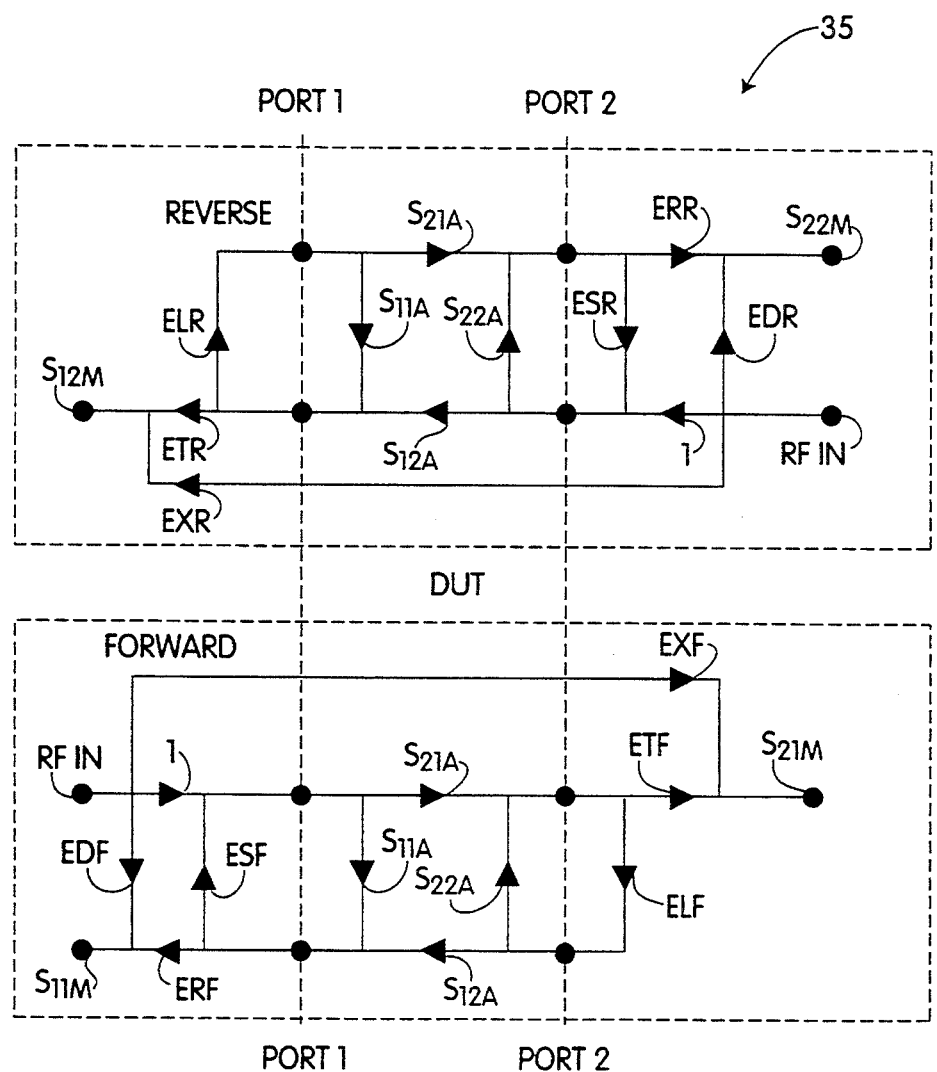
FIG. 7 is a flow-diagram of a two-port, twelve-term, error model for use with the two-port network according to this invention.

FIG. 7 is a two-port, twelve-term error correction model 35 which may be used to model the systematic errors in a conventional VNA setup. In FIG. 7, the subscript notation is as follows: M stands for measurements made by the VNA which is being calibrated. A stands for actual measurements which were preformed by a VNA at a metrology laboratory; F stands for measurement in the forward direction (looking into the two-port network from Port 1) and R indicates measurements in the reverse direction (looking into Port 2 of the two-port network).

As is known in the prior art, the error correction model requires the connection of a number of known calibration standards to the ports of the VNA in order to determine the error coefficients in the twelve-term error model. In accordance with the preferred embodiment of the present invention, there need only be a one-time connection to each port of the VNA. Such connections are typically made to both ports simultaneously. Thereafter, the two-port network and computer control provide a number of impedance standards, a low-loss through-connection and a high isolation to the VNA ports. These conditions are measured by the VNA and then the twelve-term error coefficients are calculated.

In addition, the accuracy of the calibration is be increased where the number of impedances presented at both ports of the two-port can be greater than that required to compute the unknown error coefficients, and therefore the additional impedance measurements may be used to improve the accuracy for the unknown coefficients. Furthermore, the random error of the measurement calibration is substantially reduced due to the fact that only one connection to the VNA ports is required. Thus, it is possible to reduce the random and systematic errors in the calibration and to improve the accuracy of the DUT measurement.

In addition, the calibration speed will be improved over that of the prior art where there is only one connection required to the VNA and because the computer control program automatically controls the calibration without the need for operator input. An additional benefit is that the connector configuration of the DUT to be characterized does not change the calibration so long as the connectors on the two-port network are compatible with the DUT. Also, the two-port network presents a verification standard to the VNA, post calibration in order to check that the calibration was performed correctly and to insure the accuracy of the calibration without the requirement of additional connections and/or disconnections to the VNA. Furthermore, the use of the computer control and elimination of multiple connections and disconnections to the VNA, substantially eliminates possibility of human error in the calibration. Note the calibration device, according to the invention can also be used as a verification or accreditation with other instruments in addition to a VNA because of its known characteristics. For example, this device can be used to verify the accuracy of a power meter.

With reference to FIG. 5, the method by which all twelve-term, error coefficients of FIG. 7 are determined will now be described. A 16-bit digital word is input to the digital circuitry of FIG. 6 such that the PIN diodes D15 and D16 are forward biased, thereby effectively presenting a short circuit impedance at PORT 2 and also isolating PORT 2 from PORT 1. Equation 1 is derived from a flow graph analysis on the two-port, twelve-term error correction model 35 of FIG. 7 to solve for the measured reflection coefficient at PORT 1

$S_{11M}$. In Equation 1, the terms $S_{11A}$, $S_{22A}$, $S_{21A}$, and $S_{12A}$, are the actual scattering parameters of the impedances presented by the two port network measured by the metrology laboratory VNA.

$$S_{11M} = \qquad (1)$$
$$EDF + ERF \frac{S_{11A} - ELF\ Det[SA]}{1 - ESF\ S_{11A} - ELF\ S_{22A} + ESF\ ELF\ Det[SA]}$$

$$Det\ [SA] = S_{11A} S_{22A} - S_{21A} S_{12A}$$

that $S_{21A} = S_{12A} = 0$, Equation 1 reduces to Equation 2.

$$S_{11M} = EDF + ERF \frac{S_{11A}}{1 - ESF\ S_{11A}} \qquad (2)$$

This condition is achieved practically, as described above, by forward biasing diodes D15 and D16 such that PORT 2 is isolated from PORT 1. In Equation 2, the coefficient $S_{11A}$ is representative of the predetermined reflection coefficients measured by a VNA at a metrology laboratory (when diodes D15 and D16 and at least one other diode D1–D14 is "on") for various impedances presented at PORT 1. Therefore, by measuring at least three known impedances at PORT 1, the three error terms forward directivity EDF, forward reflection tracking ERF and forward source match ESF in Equation 2 can be solved for mathematically. Additionally, improved accuracy in the calibration measurements may be achieved, by measuring more than three impedances at PORT 1 and performing a least sum squares fitting algorithm on the computed error terms.

Since the circuit in FIG. 5 is symmetrical, the same technique can be used at PORT 2. Equation 3 is the measured reflection coefficient $S_{22M}$ equation derived using a flow graph analysis at PORT 2 based on the error model of FIG. 7.

$$S_{22M} = \qquad (3)$$
$$EDR + ERR \frac{S_{22A} - ELR\ Det[SA]}{1 - ESR\ S_{22A} - ELR\ S_{11A} + ESR\ ELR\ Det[SA]}$$

By forward biasing PIN diodes D1 and D2 PORT 1 of the two-port network is isolated from PORT 2. As can be seen from Equation 3, if $S_{21A} = S_{12A} = 0$ then Equation 3 reduces to Equation 4.

$$S_{22M} = EDR + ERR \frac{S_{22A}}{1 - ESR\ S_{22A}} \qquad (4)$$

A number of predetermined impedances can be presented at PORT 2 by forward biasing diodes D1 and D2 and at least one of diodes D3–D16. These impedances can be measured and used to calculate the three error terms reverse directivity EDR, reverse reflection tracking ERR and the reverse source match ESR of Equation 4. In addition, as discussed above, by measuring more than three known impedances and using a least sum squares fitting algorithm, the accuracy of the computed error terms may be increased.

Equations 5 and 6 are the measured transmission coefficients in the forward direction (looking into the two-port network from PORT 1) and the reverse direction (looking into the two-port network from PORT 2) derived using the same flow graph analysis technique on the two-port error correction model.

$$S_{21M} = \qquad (5)$$
$$EXF + ETF \frac{S_{21A}}{1 - ESF\ S_{11A} - ELF\ S_{22A} + ESF\ ELF\ DET[SA]}$$

$$S_{12M} = \qquad (6)$$
$$EXR + ETR \frac{S_{12A}}{1 - ESR\ S_{22A} - ELR\ S_{11A} + ELR\ ESR\ DET[SA]}$$

It is clear from Equations 5 and 6, that if $S_{21A} = 0$ then Equation 5 reduces to Equation 7.

$$S_{21M} = EXF \qquad (7)$$

Similarly, it is clear from Equation 6, that if $S_{12A} = 0$ that Equation 6 reduces to Equation 8.

$$S_{12M} = EXR \qquad (8)$$

These conditions $S_{12A} = S_{21A} = $ Zero are accomplished by forward biasing all of the PIN diodes D1–D16 such that a large value of attenuation exists between PORTS 1 and 2.

By measuring the transmission coefficients S21M and S12M (see Equations 7 and 8) when all of the diodes D1–D16 are forward biased, the error terms forward isolation EXF and reverse isolation EXR can be computed.

Referring to the twelve-term, error correction model of FIG. 7, the scattering coefficients $S_{11A}$, $S_{21A}$, $S_{22A}$, and $S_{12A}$ are the known scattering parameters measured at the metrology laboratory in the original characterization of the two-port network. The values are measured during the initial characterization of the two-port network for the conditions where all of the PIN diodes D1–D16 are reverse biased. In addition, the one-port error terms for PORT 1 and PORT 2 were determined previously by the method described above. Therefore, by measuring the impedances at PORT 1 and PORT 2 where all of the PIN diodes are reverse biased, the error terms forward load match ELF and reverse load match ELR can be computed from Equations 9 and 10.

$$ELF = \frac{(S_{11M} - EDF) - (S_{11M} - EDF)(ESF\ S_{11A}) - ERF\ S_{11A}9)}{(S_{11M} - EDF)S_{22A} - (S_{11M} - EDF)(ESF\ Det[SA]) - ERF\ Det[SA]}$$

$$ELR = \frac{(S_{22M} - EDR) - (S_{22M} - EDR)(ERR\ S_{22A}) - ESR\ S_{22A}}{(S_{22M} - EDR)S_{11A} - (S_{22M} - EDR)(ESR\ Det[SA]) - ERR\ Det[SA]} \qquad (10)$$

In addition, by measuring the through-connection from PORT 1 to PORT 2 with a signal source at PORT 1 and alternatively from PORT 1 to PORT 2 with a single source at PORT 2, while PIN diodes D1–D16 are reverse biased, the error terms forward transmission tracking ETF and reverse transmission tracking ETR can be computed from Equations 11 and 12.

$$ETF = \frac{(S_{21M} - EXF)[1 - ESF\ S_{11A} - ELF\ S_{22A} + ESF\ ELF\ Det[SA]]}{S_{21A}} \qquad (11)$$

$$ETR = \frac{(S_{12M} - EXR)[1 - ESR\ S_{22A} - ELR\ S_{11A} + ELR\ ESR\ \text{Det}[SA]]}{S_{12A}} \quad (12)$$

Thus, all of the twelve-term error coefficients of the two-port error model of FIG. 7 can be computed using the method described above and without requiring any connection or disconnection of the two-port network and without any human intervention.

Furthermore, after the above-described calibration, the two-port network can then simulate known transmission and reflection coefficients which have not been presented during the calibration procedure described above and can be used as a verification standard for the purpose of checking the accuracy of the calibration. This can be done immediately after the calibration, with the aid of the software and without any need for connections or disconnections of the two-port network or any human intervention.

Once the two-port network has been measured on a VNA by a metrology laboratory, then it may be used as a calibration standard by other VNAs. Accordingly, it is desirable that the two-port network continue to reproduce the same conditions at its two ports that were measured by the VNA of the metrology laboratory.

Therefore, in accordance with a preferred embodiment of the present invention, a heater is provided to insure the long term temperature stability of the electronic circuitry of the present invention. In accordance with the preferred embodiment, the temperature is fixed at a temperature of 41° C. using a heating element located within a box or other enclosure for the circuitry (not shown).

Figure 8:
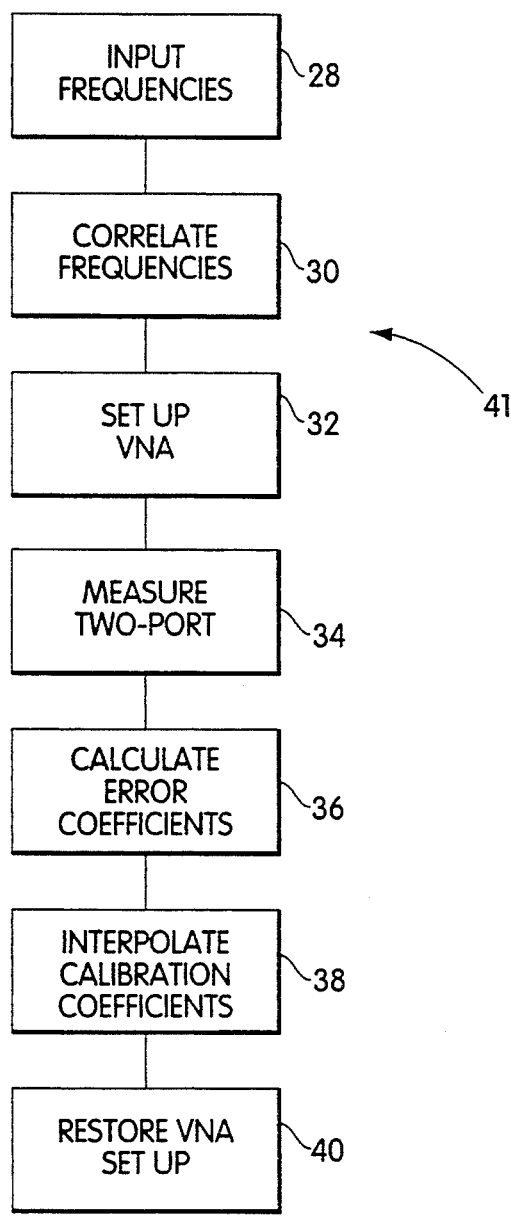
FIG. 8 is a flow diagram illustrating a computer control procedure for obtaining calibration coefficients using the two-port network according to this invention.

Referring now to FIG. 8, a flow diagram 41 of a method of controlling and calibrating the VNA is shown. First, the user inputs the frequencies to the computer (Step 28) at which a measurement of the DUT is to be performed. The frequencies are then correlated (Step 30) with the frequencies of the premeasured two-port device to determine at which frequencies the calibration should be performed. Next the VNA is set up (Step 32) by loading the frequencies into the VNA in order to perform the calibration. Then the measurement of the two-port network is performed (Step 34), according to the method described above. Once the two-port measurements are finished, the error terms of the error model are computed (Step 36). These error terms are then used to interpolate to the appropriate frequencies for the DUT to be measured (Step 38). The VNA is then restored to its initial condition (Step 40) so that the two-port network can be disconnected and the DUT can be connected for measurement.

In this embodiment, the control routine 41 is provided by a computer 16 (FIG. 4) having interconnections with the two-port network 14 and VNA 12. In the example of a Model 8510 Hewlett-Packard network analyzer, the computer is interconnected via line 18 to a standard port using a IEEE-488 standard connector. As noted above, the functions of computer 16 can be incorporated directly into the two-port network 14 or can be provided to the VNA 12.

Figure 9:
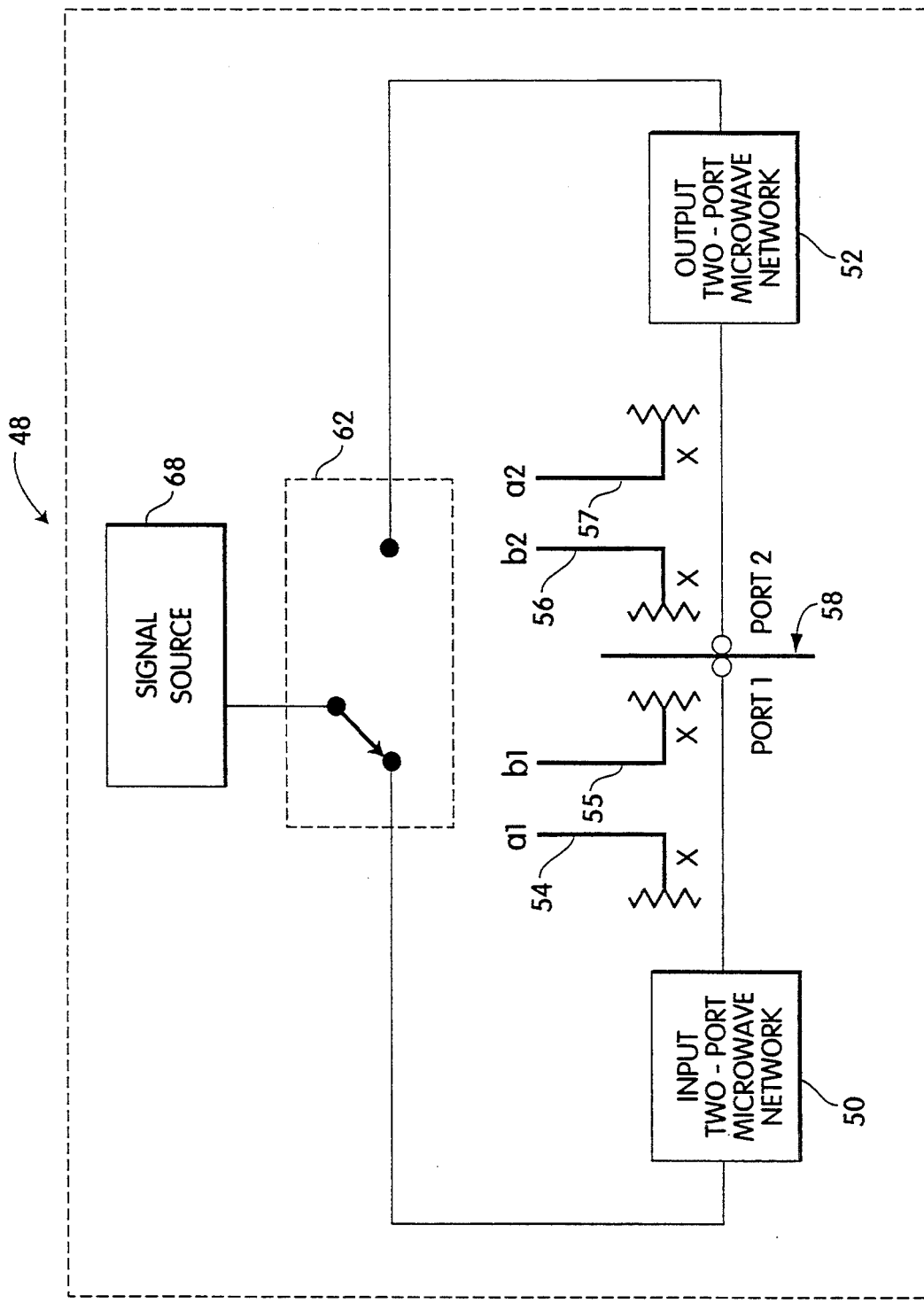
FIG. 9 is a schematic diagram of a self-calibration circuit using a pair of two-port networks according to this invention.

Another application of the two-port network of the present invention is that it can be placed inside the VNA test set in order to derive a self-calibrating circuit 48 for a VNA. Referring to FIG. 9, the two essentially identical two-port microwave networks 50 and 52 are placed after the couplers 54, 55, 56 and 57 and present reflections at PORT 1 and PORT 2 of the VNA test set. With this embodiment, it is possible to calibrate the two networks once and thereafter to use the two networks as a self-calibrating VNA. Thus, it is possible to initially characterize the self-calibrating VNA, and then thereafter it is possible to self-calibrate the VNA each time that the VNA is to be used simply by making a through-connection between PORTS 1 and 2 of the self-calibrating VNA.

Referring to FIG. 9, the initial calibration procedure to characterize the self-calibrating VNA is accomplished by performing a calibration at the device reference plane 58. This is accomplished by reverse biasing all of the PIN diodes in each two-port network in order to establish a low loss through each network. The signal from signal source 68 may then be presented to PORT 1 by selecting the appropriate position of switch 62. The PIN diodes of the output two-port microwave network are forward biased in order to step through different impedances. The reflection coefficients resulting from the various impedances presented by the output two-port microwave network 52 are measured at the device reference plane 58 thereby characterizing the output two-port microwave network 52.

Similarly, the input two-port microwave network 50 is characterized by reverse biasing all of the PIN diodes of the output two-port microwave network switching the position of switch 62 to send the RF signal to PORT 2 and stepping the PIN diodes of the input two-port microwave network 50 through various impedances and measuring the reflection coefficients at the device reference plane 58.

Once the self-calibrating VNA has been initially characterized, as per the steps described above, the two-port networks can then be stepped through various impedances according to the steps described below to self-calibrate the VNA, without the need for making numerous connections or disconnections to PORTS 1 or 2 of the VNA or the need for human intervention. The steps of the self-calibration procedure of a self-calibrating VNA as initially characterized above are as follows according to one embodiment:

(1) Establish a through-connection between PORTS 1 and 2 of the VNA; (2) determine the directivity EDF, source match ESF and reflection tracking ERF error terms at PORT 1 by measuring three impedances presented by the output two-port microwave network 52 and (3) compute the error terms based upon the known initial values of these impedances $S_{11A}$ and utilizing Equation 2 as described above.

Then, (4) determine the directivity EDR, source match ESR and reflection tracking ERR error terms at PORT 2 by measuring the reflection coefficients presented at the device reference plane 58 by stepping the input two-port microwave network through its various known impedances as characterized initially and utilizing Equation 4 to compute the error terms as described above.

Then, (5) determine forward ELF and reverse ELR load match error terms by reverse biasing all of the PIN diodes of both the input and output microwave network and utilizing Equations 9 and 10 as discussed above. In Equations 9 and 10, $S_{11A}=S_{22A}=0$ and $S_{21A}=S_{12A}=1$ where there is now a through-connection between the ports of the VNA instead of a two-port network.

Next, (6) measure the forward $S_{21M}$ and reverse $S_{12M}$ transmission coefficients, with all of the PIN diodes in both two-port networks reverse biased. Since all the parameters in Equations 11 and 12 are known, with the exception of forward isolation EXF and reverse isolation EXR, by disconnecting the through-connection between PORTS 1 and 2 and reverse biasing, all of the PIN diodes of the input and output two-port networks, the error terms EXF and EXR can be calculated utilizing Equations 7 and 8 as discussed previously. With the error terms EXF and EXR known, forward transmission tracking ETF and reverse transmission tracking ETR can be calculated utilizing Equations 11 and 12. Thus, all of the error terms can be calculated with the embodiment as shown in FIG. 9. Since the cable between PORTS 1 and 2 should be disconnected in order to make the DUT measurements, no extra steps are needed with the technique described above.

Figure 10:
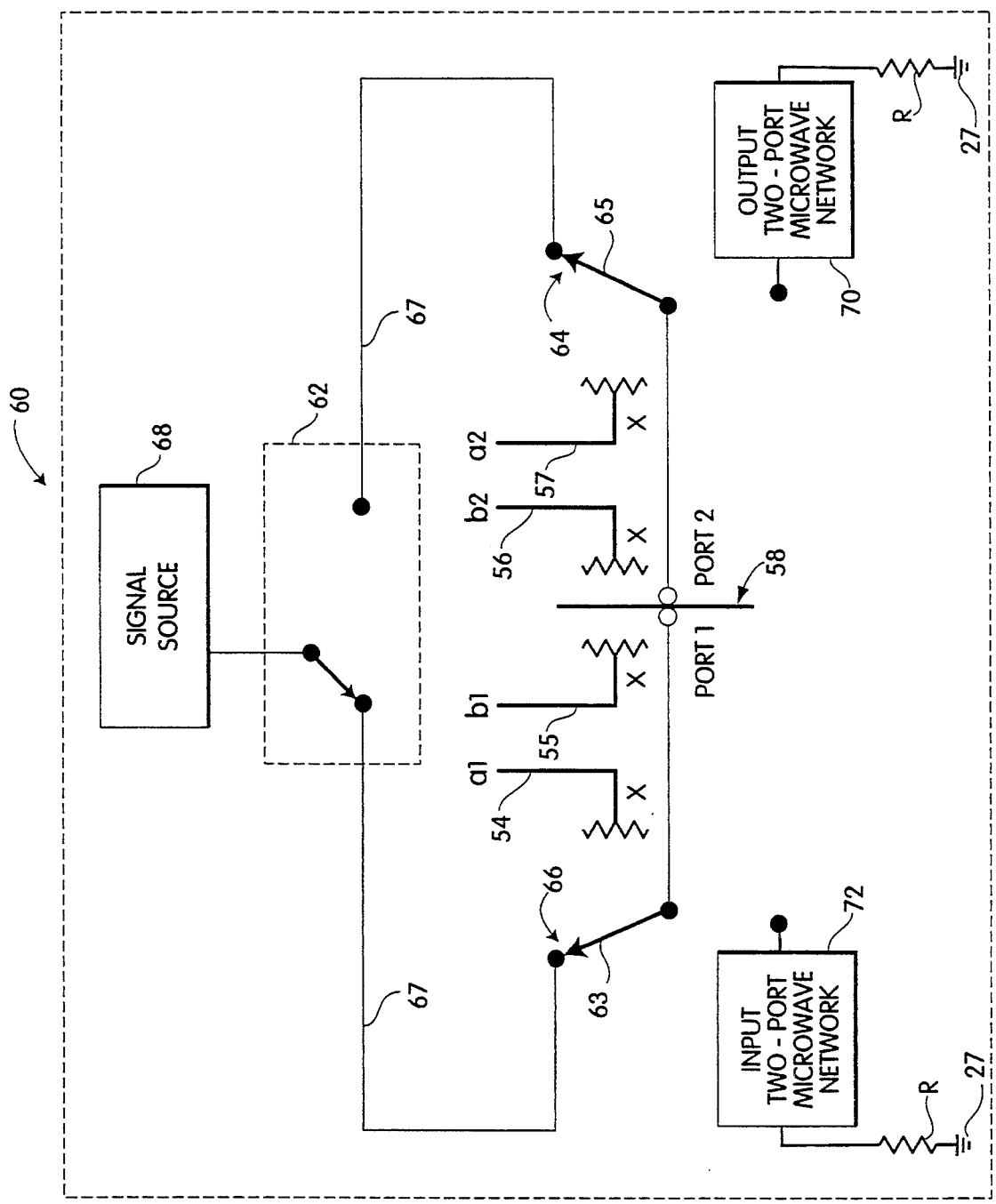
FIG. 10 is an alternative embodiment of a self-calibration circuit using two-port networks according to this invention.

FIG. 10 is an alternate embodiment of a self-calibrating circuit 60 for a VNA which can be utilized in the same manner as described above with respect to the embodiment in FIG. 9, except that the initial calibration utilizing the conventional calibration technique is performed with single-pole-double-throw switches 62 and 64 configured such that PORT 1 and PORT 2 are connected to the throws 63 and 65 which are connected to the cabling 67 from the signal source 68. Each of the input and output two-port microwave networks 72 and 70 respectively are connected to ground via resistor R having a value of 50 ohms. Thereafter the self-calibration routine can be performed using the steps described above where the single pole double throw switches will be connected to the two-port microwave network which is being utilized to establish the known impedances. In other words, single-pole-double-throw switch 62 is connected to the signal source 68, while single-pole-double-throw switch 64 is connected to the output two-port microwave network 70 to characterize the output two-port microwave network 70. Similarly, single-pole-double-throw switch 65 is connected to the signal source 68 while single-pole-double-throw switch 62 is connected to the input two-port microwave network 72 to characterize the input two-port microwave network 72. Thereafter, the self-calibration routine is performed utilizing the steps described above with respect to the embodiment of FIG. 9.

Having now described the foregoing embodiments of the invention, it should be clear to those skilled in the art that the foregoing is merely illustrative and not limiting, having been presented by way of example only. Numerous modifications and other embodiments are within the scope of one of ordinary skill in the art and are contemplated as falling within the scope of the invention as defined by the pending claims in equivalents thereto and this description should be taken only by way of example.

What is claimed is:

1. An RF calibration device including a first port and a second port, at least one of the first port and the second port being coupled to a first port and a second port of a network analyzer for making measurements, respectively, the RF calibration device comprising:
   a calibration standard which generates a plurality of conditions as necessary at calibrate the network analyzer, to at least one reference plane, the plurality of conditions being generated free of additional connections or disconnections of additional calibration standards to either one of the first port and the second port of the network analyzer during a calibration procedure; and
   a processor that determines systematic errors of the network analyzer based upon the measurements of the plurality of conditions, with the network analyzer.

2. The calibration device as claimed in claim 1, wherein the at least one of the first port and the second port of the calibration device are connected, respectively, only once at a beginning of the calibration procedure, to the first port and the second port of the network analyzer.

3. The calibration device as set forth in claim 1, further comprising a plurality of solid state switching devices, each of the solid state switching devices being interconnected by a predetermined length of transmission line to form the first port and the second port of the calibration device.

4. A calibration device as set forth in claim 3, further comprising a controller which biases predetermined of the plurality of solid state switching devices to generate the predetermined conditions.

5. A calibration device as set forth in claim 4, wherein the processor operates the controller in response to a predetermined procedure, the processor recording measurements by the network analyzer based upon each of the predetermined conditions and deriving therefrom calibration coefficients.

6. A calibration device as set forth in claim 1, wherein the plurality of conditions include:
   a plurality of complex reflection coefficients;
   a low-loss transmission connection; and
   a high isolation condition.

7. A calibration device as set forth in claim 3, wherein one of the solid state switching devices comprises a PIN diode.

8. An RF calibration device including a first port and a second port, at least one of the first port and the second port being coupled to a first port and a second port of a network analyzer, respectively, the calibration device comprising:
   a multistate transfer standard that generates a plurality of conditions as necessary to calibrate the network analyzer, to at least one reference plane, the plurality of conditions being generated free of connecting or disconnecting additional calibration standards to either one of the first port and the second port of the network analyzer during a calibration procedure.

9. A calibration device as set forth in claim 8 wherein the multistate transfer standard comprises a plurality of solid state switching devices, each of the solid state switching devices being interconnected by a predetermined length of transmission line to form the first port and the second port of the calibration device.

10. A calibration device as set forth in claim 9, further comprising a controller which biases predetermined of the plurality of switching devices to generate the plurality of conditions.

11. A calibration device as set forth in claim 10 further comprising a control computer that operates the controller in response to a predetermined procedure, the control computer recording measurements of the network analyzer based upon each of the conditions and deriving therefrom calibration coefficients to calibrate the network analyzer.

12. A calibration device as set forth in claim 11 wherein the plurality of conditions include:
   a plurality of complex reflection coefficients;
   a low-loss transmission connection; and a high isolation condition.

13. A calibration device as set forth in claim 11 wherein the plurality of conditions are presented to a first port of the network analyzer for performing a one-port calibration.

14. A calibration device as set forth in claim 11 wherein the plurality of conditions are presented to the first port and the second port of the network analyzer for performing a two-port calibration.

* * * * *

UNITED STATES PATENT AND TRADEMARK OFFICE
CERTIFICATE OF CORRECTION

PATENT NO.   :   5,434,511
DATED        :   July 18, 1995
INVENTOR(S)  :   Vahe A. Adamian, Michael T. Falcinelli and Peter V. Phillips It is certified that error appears in the above-identified patent and that said Letters Patent is hereby corrected as shown below:

In column 13, line 62, delete "at" and insert --to--.

Signed and Sealed this

Thirty-first Day of October 1995

Attest:

BRUCE LEHMAN

Attesting Officer        Commissioner of Patents and Trademarks